US012800658B2

(12) United States Patent
Kim

(10) Patent No.: US 12,800,658 B2
(45) Date of Patent: Nov. 17, 2026

(54) CIRCUIT AND METHOD FOR DIAGNOSING WELDING OF RELAY

(71) Applicant: LG ENERGY SOLUTION, LTD., Seoul (KR)

(72) Inventor: Semin Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 678 days.

(21) Appl. No.: 18/278,091

(22) PCT Filed: Oct. 14, 2022

(86) PCT No.: PCT/KR2022/015623
§ 371 (c)(1),
(2) Date: Aug. 21, 2023

(87) PCT Pub. No.: WO2023/101206
PCT Pub. Date: Jun. 8, 2023

(65) Prior Publication Data

US 2024/0053412 A1 Feb. 15, 2024

(30) Foreign Application Priority Data

Dec. 2, 2021 (KR) ........................ 10-2021-0170980

(51) Int. Cl.
*G01R 31/327* (2006.01)
*B60L 58/10* (2019.01)
(Continued)

(52) U.S. Cl.
CPC ........ *G01R 31/3278* (2013.01); *H01M 10/48* (2013.01); *H01M 10/482* (2013.01); *B60L 58/10* (2019.02); *H01M 2010/4271* (2013.01)

(58) Field of Classification Search
CPC ......... H01M 10/48; H01M 2010/4271; H01M 10/4257; H01M 10/4285; H01M 2010/4278; G01R 31/3278
See application file for complete search history.

(56) References Cited

U.S. PATENT DOCUMENTS

2002/0070608 A1* 6/2002 Matsuki ................ B23K 31/02 324/420
2003/0007305 A1 1/2003 Yugou
(Continued)

FOREIGN PATENT DOCUMENTS

CN 1362920 A 8/2002
CN 107390117 A 11/2017
(Continued)

OTHER PUBLICATIONS

International Search Report (PCT/ISA/210) issued in PCT/KR2022/015623, dated Jan. 20, 2023.
(Continued)

*Primary Examiner* — Imran Akram
(74) *Attorney, Agent, or Firm* — Birch, Stewart, Kolasch & Birch, LLP

(57) ABSTRACT

A battery system can include a battery pack; a first main relay connected to a positive terminal of the battery pack and a second main relay connected to a negative terminal of the battery pack; a first control relay connected between the first main relay and a positive terminal of an inverter and a second control relay connected between the second main relay and a negative terminal of the inverter; a welding diagnosing circuit including a first resistor and a first photocoupler connected between the positive terminal of the battery pack and the negative terminal of the inverter and a second resistor, and a second photocoupler connected between the negative terminal of the inverter and the negative terminal of the battery pack; and a battery management
(Continued)

system (BMS) configured to drive the first and second photocouplers to diagnose welding of the second control relay.

13 Claims, 4 Drawing Sheets

(51) Int. Cl.
*H01M 10/42* (2006.01)
*H01M 10/48* (2006.01)

(56) References Cited

U.S. PATENT DOCUMENTS

| | | | | |
|---|---|---|---|---|
| 2007/0139005 | A1 | 6/2007 | Osawa | |
| 2008/0079434 | A1* | 4/2008 | Oosawa | H01M 10/48 324/433 |
| 2013/0106423 | A1 | 5/2013 | Moon et al. | |
| 2013/0257440 | A1* | 10/2013 | Takahashi | G01R 31/327 324/418 |
| 2013/0264995 | A1* | 10/2013 | Lee | B60L 53/14 320/104 |
| 2015/0115972 | A1 | 4/2015 | Park | |
| 2015/0266388 | A1 | 9/2015 | Im | |
| 2015/0323603 | A1* | 11/2015 | Kim | G01R 31/327 702/58 |
| 2015/0346282 | A1 | 12/2015 | Jeon | |
| 2017/0336476 | A1 | 11/2017 | Wand | |
| 2018/0006340 | A1* | 1/2018 | Yamamoto | B60L 3/0084 |
| 2018/0067149 | A1 | 3/2018 | Kim et al. | |
| 2018/0069388 | A1* | 3/2018 | Kim | H02H 7/18 |
| 2018/0299500 | A1 | 10/2018 | Lee | |
| 2019/0187211 | A1 | 6/2019 | Muller et al. | |
| 2019/0210481 | A1* | 7/2019 | Ishida | B60L 3/0046 |
| 2020/0049770 | A1 | 2/2020 | Ham | |
| 2021/0359346 | A1* | 11/2021 | Ito | H01M 10/425 |
| 2021/0391736 | A1 | 12/2021 | Li et al. | |

FOREIGN PATENT DOCUMENTS

| | | | | |
|---|---|---|---|---|
| CN | 208959328 | U | 6/2019 | |
| CN | 110537287 | A | 12/2019 | |
| CN | 112436572 | A | 3/2021 | |
| CN | 113504464 | A | 10/2021 | |
| DE | 10 2017 223 229 | A1 | 6/2019 | |
| JP | 2000-173428 | A | 6/2000 | |
| JP | 3789819 | B2 | 6/2006 | |
| JP | 4510753 | B2 | 7/2010 | |
| JP | 2011-135767 | A | 7/2011 | |
| JP | 2013-219955 | A | 10/2013 | |
| JP | 2015-82502 | A | 4/2015 | |
| JP | 2018-68035 | A | 4/2018 | |
| JP | 2020-54160 | A | 4/2020 | |
| JP | 2023-504310 | A | 2/2023 | |
| KR | 10-1241226 | B1 | 3/2013 | |
| KR | 10-2013-0032504 | A | 4/2013 | |
| KR | 10-2013-0079843 | A | 7/2013 | |
| KR | 10-2013-0119666 | A | 11/2013 | |
| KR | 10-2014-0007180 | A | 1/2014 | |
| KR | 10-2014-0136844 | A | 12/2014 | |
| KR | 10-2015-0047367 | A | 5/2015 | |
| KR | 10-2015-0109153 | A | 10/2015 | |
| KR | 10-2016-0103294 | A | 9/2016 | |
| KR | 10-1712258 | B1 | 3/2017 | |
| KR | 10-1797670 | B1 | 11/2017 | |
| KR | 10-2020-0075095 | A | 6/2020 | |
| KR | 20200075095 | A * | 6/2020 | G01R 31/382 |
| KR | 10-2210282 | B1 | 2/2021 | |
| KR | 10-2322753 | B1 | 11/2021 | |

OTHER PUBLICATIONS

Extended European Search Report for European Application No. 22901566.4, dated Sep. 9, 2024.

* cited by examiner

【Figure 1】
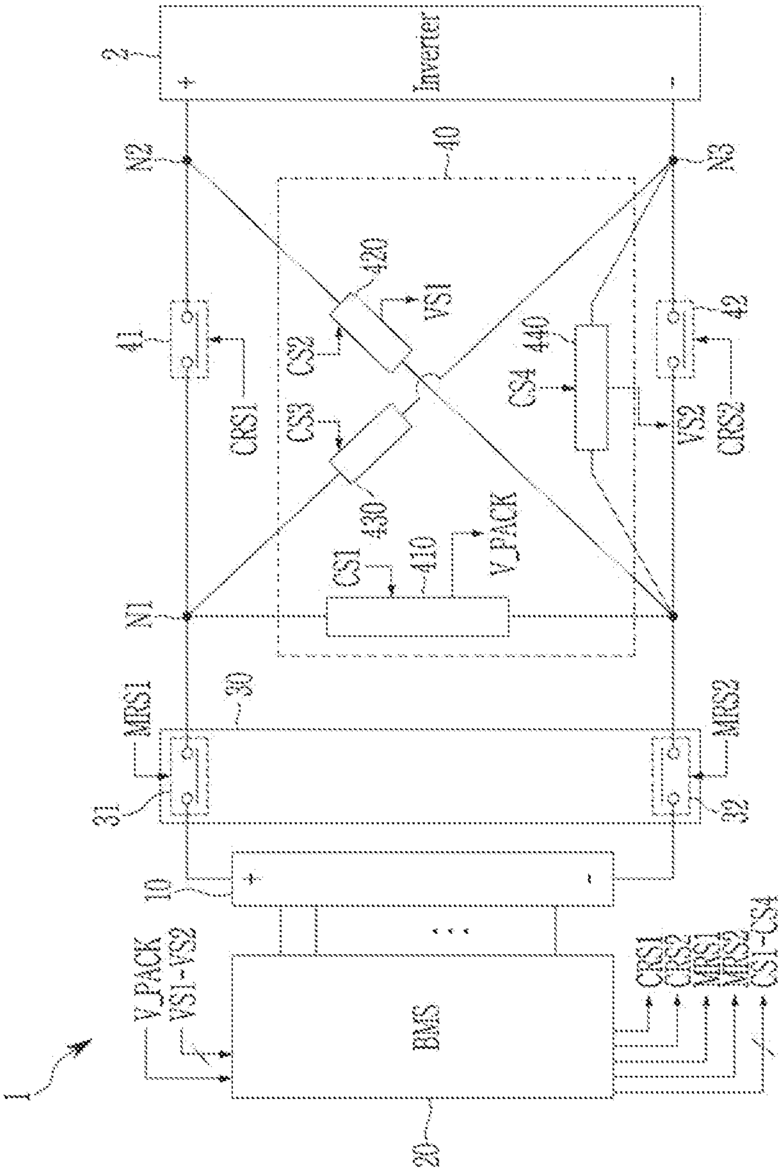

【Figure 2】
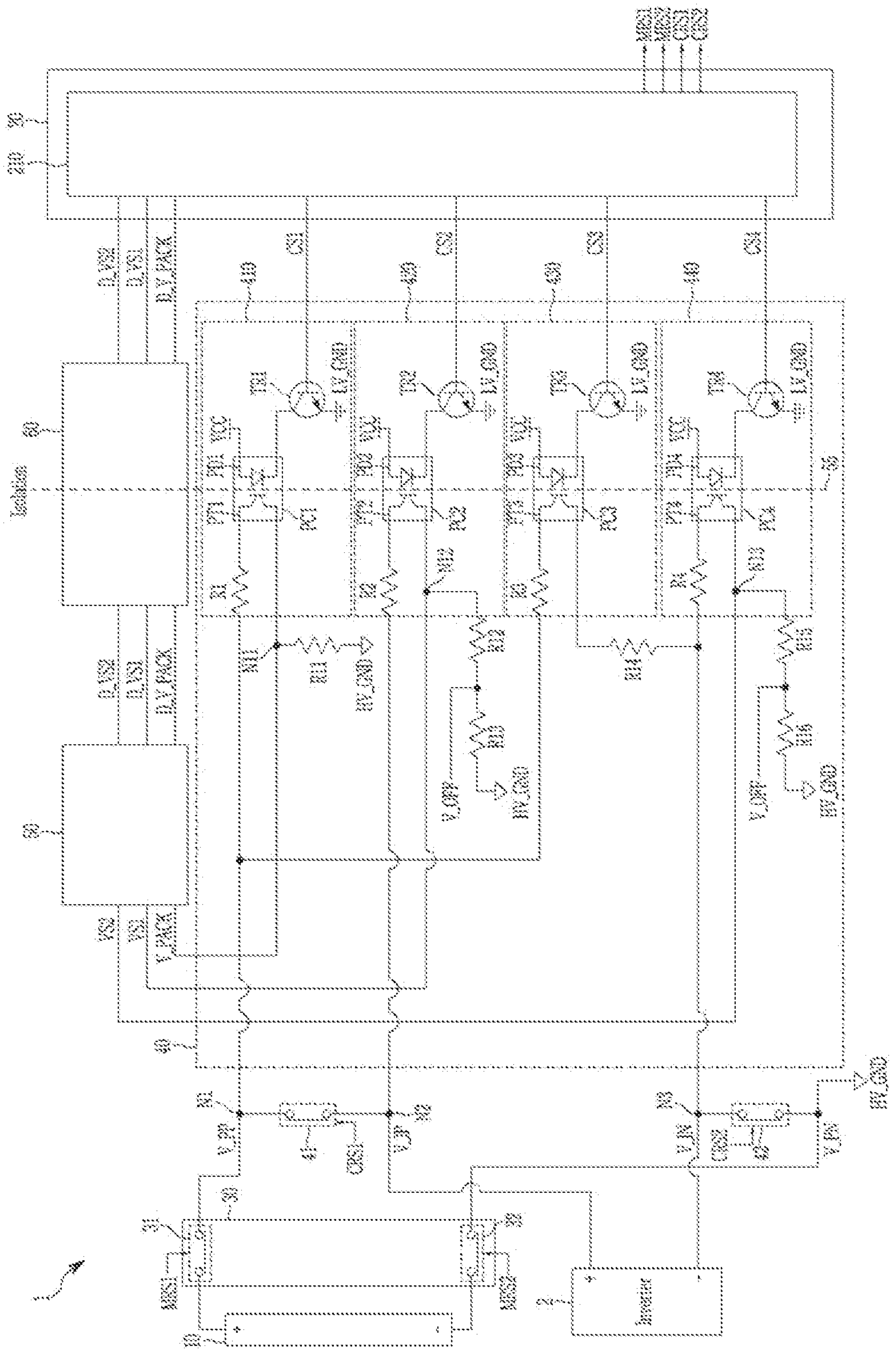

【Figure 3】
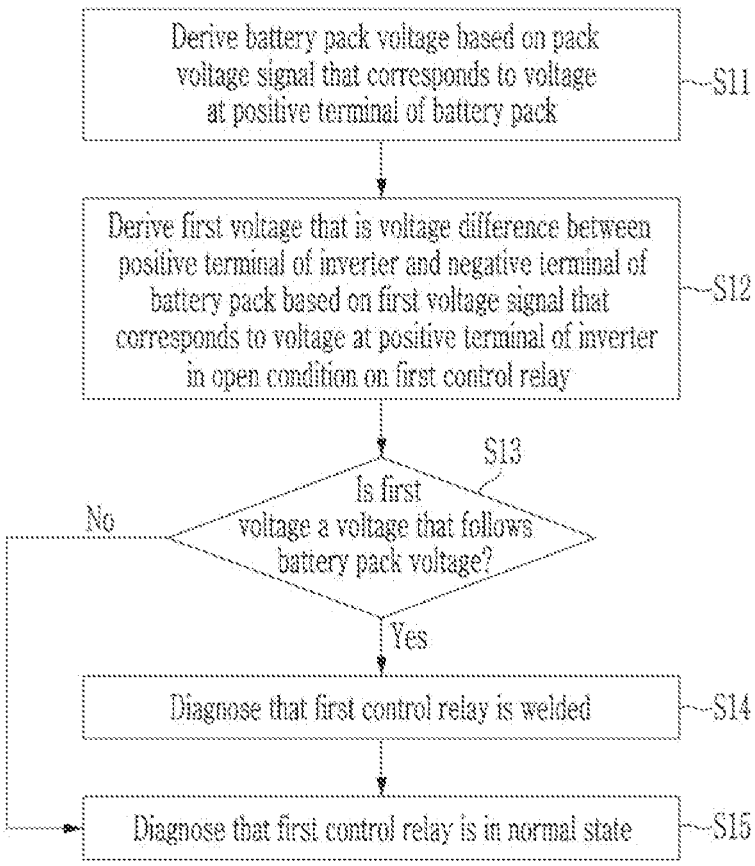

【Figure 4】
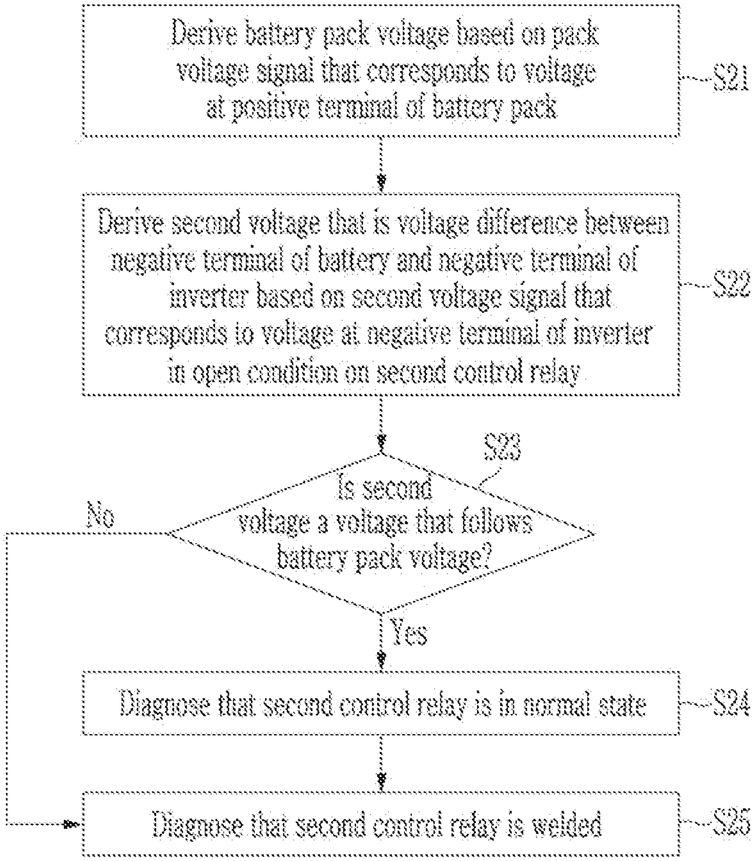

CIRCUIT AND METHOD FOR DIAGNOSING WELDING OF RELAY

TECHNICAL FIELD

This application claims priority to and the benefit of Korean Patent Application No. 10-2021-0170980 filed in the Korean Intellectual Property Office on Dec. 2, 2021, the entire contents of which are incorporated herein by reference.

The present disclosure relates to a relay welding diagnosing circuit and relay welding diagnosing method.

BACKGROUND ART

A battery system may include a relay for a positive terminal and a relay for a negative terminal of a battery. When at least one of the relay for a positive terminal and the relay for a negative terminal is welded, reliability on the battery system is deteriorated to thus give influences to the battery performance (i.e., to influence battery performance). Therefore, it is needed to diagnose whether the relay included in the battery system is welded.

Particularly, the relay for a negative terminal may be connected to a ground level, which causes difficulties in diagnosing welding of the relay.

DISCLOSURE

The present invention has been made in an effort to provide a relay welding diagnosing circuit for diagnosing which relay is welded from among a plurality of relays connected to a battery pack by measuring a battery pack voltage in a battery system including a battery pack, and a relay welding diagnosing method.

An embodiment of the present invention provides a battery system including: a battery pack; a first main relay having a first end connected to a positive terminal of the battery pack and a second main relay having a first end connected to a negative terminal of the battery pack; a first control relay connected between the first main relay and a positive terminal of an inverter and a second control relay connected between the second main relay and a negative terminal of the inverter; a welding diagnosing circuit including a first resistor and a first photocoupler connected between the positive terminal of the battery pack and the negative terminal of the inverter and a second resistor and a second photocoupler connected between the negative terminal of the inverter and the negative terminal of the battery pack; and a battery management system (BMS) for driving the first and second photocouplers to diagnose welding of the second control relay.

The BMS may transmit a first control signal for driving the first photocoupler and a second control signal for driving the second photocoupler to the welding diagnosing circuit and may receive a first voltage signal corresponding to the negative terminal of the inverter when the first and second photocouplers are driven according to the first and second control signals, in an open control condition of the second control relay.

The BMS may derive a first voltage difference between the negative terminal of the inverter and the negative terminal of the battery pack based on the first voltage signal.

The BMS may diagnose that the second control relay is not welded when the first voltage difference is a voltage that follows a battery pack voltage between a positive terminal of the battery pack and a negative terminal of the battery pack.

The BMS may diagnose that the second control relay is welded when the first voltage difference is different from a voltage that follows the battery pack voltage between the positive terminal of the battery pack and the negative terminal of the battery pack.

The welding diagnosing circuit may further include a third resistor and a third photocoupler connected between a positive terminal of the inverter and the negative terminal of the battery pack, and the BMS may drive the third photocoupler to diagnose welding of the first control relay.

The BMS may transmit a third control signal for driving the third photocoupler to the welding diagnosing circuit and may receive a second voltage signal that corresponds to the positive terminal of the inverter when the third photocoupler is driven according to the third control signal, in the open control condition of the first control relay.

The BMS may derive a second voltage difference that corresponds between the positive terminal of the inverter and the negative terminal of the battery pack based on the second voltage signal.

The BMS may diagnose that the first control relay is welded when the second voltage difference is a voltage that follows the battery pack voltage between the positive terminal of the battery pack and the negative terminal of the battery pack.

The BMS may diagnose that the first control relay is not welded when the second voltage difference is different from a voltage that follows the battery pack voltage between the positive terminal of the battery pack and the negative terminal of the battery pack.

Another embodiment of the present invention provides a method for diagnosing welding of a relay including: allowing a battery management system (BMS) to derive a battery pack voltage that corresponds to a voltage between a positive terminal and a negative terminal of a battery pack based on a voltage at the positive terminal of the battery pack; connecting a gap between the positive terminal of the battery pack and a negative terminal of an inverter through a first resistor; connecting a gap between the negative terminal of the inverter and the negative terminal of the battery pack through a second resistor; and when a voltage between the negative terminal of the inverter and the negative terminal of the battery pack is a voltage that follows the battery pack voltage, allowing the BMS to diagnose that a first control relay connected between the negative terminal of the battery pack and the negative terminal of the inverter is not welded.

The method may further include, when a voltage between the negative terminal of the inverter and the negative terminal of the battery pack is different from a voltage that follows the battery pack voltage, allowing the BMS to diagnose that the first control relay is welded.

The method may further include: connecting a gap between a positive terminal of the inverter and the negative terminal of the battery pack through a third resistor; and when a voltage between the positive terminal of the inverter and the negative terminal of the battery pack follows the battery pack voltage, allowing the BMS to diagnose that a second control relay connected between the positive terminal of the battery pack and the positive terminal of the inverter is welded.

The method may further include connecting: a gap between a positive terminal of the inverter and the negative terminal of the battery pack through a third resistor; and when a voltage between the positive terminal of the inverter and the negative terminal of the battery pack is different from the voltage that follows the battery pack voltage, allowing the BMS to diagnose that a second control relay connected between the positive terminal of the battery pack and the positive terminal of the inverter is not welded.

According to the present disclosure, regarding the battery system including a battery pack, the relay welding diagnosing circuit for diagnosing which relay is welded from among a plurality of relays connected to the battery pack by measuring the battery pack voltage, preventing the current from flowing when the relay is opened, and allowing a safe battery pack management, and the relay welding diagnosing method are provided.

DESCRIPTION OF THE DRAWINGS

FIG. 1 shows a schematic diagram of a battery system according to an embodiment.

FIG. 2 shows a circuit diagram of a battery system including a welding diagnosing circuit according to an embodiment.

FIG. 3 shows a flowchart of a method for diagnosing welding of a first control relay according to an embodiment.

FIG. 4 shows a flowchart of a method for diagnosing welding of a second control relay according to an embodiment.

MODE FOR INVENTION

Hereinafter, embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to make the specification easier, and hence, these terms do not have meanings or roles that distinguish them from each other by themselves. In describing embodiments of the present specification, when it is determined that a detailed description of the well-known art associated with the present invention may obscure the gist of the present invention, it will be omitted. The accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like, will be used only to describe various components, and are not interpreted as limiting these components. The terms are only used to differentiate one component from other components.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

From among configurations according to an embodiment, a program that is realized with a set of instructions that are an actualized control algorithm for controlling other configurations may be installed in the configuration for controlling the other configurations in a specific control condition. A control configuration may process input data and stored data according to the installed program and may generate output data. The control configuration may include a non-volatile memory for storing a program and a memory for storing data.

FIG. 1 to FIG. 4 show a relay welding diagnosing circuit and a relay welding diagnosing method.

FIG. 1 shows a schematic diagram of a battery system according to an embodiment.

The battery system 1 includes a battery pack 10, a battery management system (BMS) 20, a main relay 30, control relays 41 and 42, and a welding diagnosing circuit 40. The battery system 1 may be electrically connected to an inverter 2.

The battery pack 10 may include a plurality of battery cells electrically connected to each other. For example, a predetermined number of battery cells are connected in series to configure a battery module, and a predetermined number of battery modules are connected in series and/or in parallel to supply a desired power voltage.

The main relay 30 may include a first main relay 31 having a first end connected to a positive terminal of the battery pack 10 and a second main relay 32 having a first end connected to a negative terminal of the battery pack 10. A node between the first main relay 31 and a first control relay 41 is referred to as a first node N1. A node between the first control relay 41 and a positive terminal of the inverter 2 is referred to as a second node N2. A node between a second control relay 42 and a negative terminal of the inverter 2 is referred to as a third node N3.

A second end of the first main relay 31 s connected to a first end of the first control relay 41, and a second end of the second main relay 32 is connected to a first end of the second control relay 42. A second end of the first control relay 41 is connected to the positive terminal of the inverter 2. A second end of the second control relay 42 is connected to the negative terminal of the inverter 2.

The BMS 20 is connected to positive electrodes and negative electrodes of the battery cells included in the battery pack 10. Closing and opening of the respective first main relay 31, the second main relay 32, the first control relay 41, and the second control relay 42 are controlled according to relay control signals MRS1, MRS2, CRS1, and CRS2 supplied by the BMS 20.

The welding diagnosing circuit 40 may include a plurality of resistor boxes 410, 420, 430, and 440. Operations of the resistor boxes 410, 420, 430, and 440 may be controlled by a plurality of control signals CS1 to CS4 supplied by the BMS 20. However, the present disclosure is not limited thereto, and the welding diagnosing circuit 40 may further include an additional control circuit for generating the control signals CS1 to CS4.

The first resistor box 410 is connected between the second end of the first main relay 31 and the second end of the second main relay 32. The second resistor box 420 is connected between the second end of the second main relay 32 and the positive terminal of the inverter 2. The third resistor box 430 is connected between the second end of the first main relay 31 and the negative terminal of the inverter 2. The fourth resistor box 440 is connected between the second end of the second main relay 32 and the negative terminal of the inverter 2.

The BMS 20 may receive a pack voltage signal V_PACK that corresponds to the battery pack voltage from the first resistor box 410. The battery pack voltage may correspond to a voltage between the positive terminal of the battery pack and the negative terminal of the battery pack. The BMS 20 may receive a first voltage signal VS1 that corresponds to a voltage between the positive terminal of the inverter and the negative terminal of the battery pack from the second resistor box 420. The BMS 20 may receive a second voltage signal VS2 that corresponds to a voltage between the negative terminal of the inverter and the negative terminal of the battery pack from the fourth resistor box 440. As the voltage at the negative terminal of the battery pack is a ground level, the battery pack voltage may be a voltage at the positive terminal of the battery pack, the voltage between the positive terminal of the inverter and the negative terminal of the battery pack is a voltage at the positive terminal of the inverter, and the voltage between the negative terminal of the inverter and the negative terminal of the battery pack is a voltage at the negative terminal of the inverter.

A welding diagnosing circuit 40 and a diagnosis method for measuring a plurality of voltages by closing and opening the first and second main relays 31 and 32 and the first and second control relays 41 and 42, and diagnosing welding of the first and second control relays 41 and 42 according to the measured voltages will now be described with reference to FIG. 2 to FIG. 4.

FIG. 2 shows a circuit diagram of a battery system including a welding diagnosing circuit according to an embodiment.

According to an embodiment, the battery system 1 may include a battery pack 10, a BMS 20, a main relay 30, first and second control relays 41 and 42, a welding diagnosing circuit 40, an analog-to-digital converter (ADC) 50, and an isolator 60. The battery system 1 may be electrically connected to the inverter 2. The BMS 20 may include a main control unit (MCU). Descriptions on the configuration repeating the configuration of FIG. 1 from among the configuration of FIG. 2 correspond to the configuration of FIG. 1.

A ground HV_GND on the configurations on a high voltage level positioned on the left (hereinafter, a high voltage side) is different from a ground LV_GND on the configurations on a low voltage level positioned on the right (hereinafter, a low voltage side) with respect to the dotted line 55 shown in FIG. 2. For example, the negative terminal of the battery pack 10 may be connected to the ground HV_GND, and emitter terminals of a plurality of transistors TR1 to TR4 may be connected to the ground LV_GND.

The welding diagnosing circuit 40 may include a plurality of resistor boxes 410, 420, 430, and 440 and a plurality of resistors R11 to R16. The first resistor box 410 may include a first resistor R1, a first photocoupler PC1, and a first transistor TR1. The first photocoupler PC1 may include a first phototransistor PT1 and a first light emitting diode PD1. The second resistor box 420 may include a second resistor R2, a second photocoupler PC2, and a second transistor TR2. The second photocoupler PC2 may include a second phototransistor PT2 and a second light emitting diode PD2. The third resistor box 430 may include a third resistor R3, a third photocoupler PC3, and a third transistor TR3. The third photocoupler PC3 may include a third phototransistor PT3 and a third light emitting diode PD3. The fourth resistor box 440 may include a fourth resistor R4, a fourth photocoupler PC4, and a fourth transistor TR4. The fourth photocoupler PC4 may include a fourth phototransistor PT4 and a fourth light emitting diode PD4.

The photocouplers PC1 to PC4 isolate the high voltage side and the low voltage side. The photocouplers PC1 to PC4 may be connected or blocked by control of the MCU 210.

An emitter of the first transistor TR1 is connected to the ground LV_GND, a collector of the first transistor TR1 is connected to a first end of the first light emitting diode PD1, and a first control signal CS1 supplied by the MCU 210 may be input to a base of the first transistor TR1. A voltage VCC may be input to a second end of the first light emitting diode PD1. A first end of the first phototransistor PT1 is connected to a first end of the first resistor R1, and a second end of the first phototransistor PT1 is connected to a first end of the resistor R11 and an input end of the ADC 50 at a node N11. A second end of the first resistor R1 is connected to a first node N1. A second end of the resistor R11 is connected to the ground HV_GND.

An emitter of the second transistor TR2 is connected to the ground LV_GND, a collector of the second transistor TR2 is connected to a first end of the second light emitting diode PD2, and a second control signal CS2 supplied by the MCU 210 may be input to a base of the second transistor TR2. The voltage VCC is input to a second end of the second light emitting diode PD2. A first end of the second phototransistor PT2 is connected to a first end of the second resistor R2, and a second end of the second phototransistor PT2 is connected to a first end of the resistor R12 and an input end of the ADC 50 at a node N12. A second end of the second resistor R2 is connected to the second node N2. A second end of the resistor R12 is connected to a first end of the resistor R13, and a predetermined offset voltage V_OFF may be applied to a node on which the second end of the resistor R12 is connected to a first end of the resistor R13. A second end of the resistor R13 is connected to the ground HV_GND.

An emitter of the third transistor TR3 is connected to the ground LV_GND, a collector of the third transistor TR3 is connected to a first end of the third light emitting diode PD3, and a third control signal CS3 supplied by the MCU 210 may be input to a base of the third transistor TR3. The voltage VCC is input to a second end of the third light emitting diode PD3. A first end of the third phototransistor PT3 is connected to a first end of the third resistor R3, and a second end of the third phototransistor PT3 is connected to a first end of the resistor R14. A second end of the third resistor R3 is connected to the first node N1. A second end of the resistor R14 is connected to the third node N3.

An emitter of the fourth transistor TR4 is connected to the ground LV_GND, a collector of the fourth transistor TR4 is connected to a first end of the fourth light emitting diode PD4, and a fourth control signal CS4 supplied by the MCU 210 may be input to the base of the third transistor TR3. The voltage VCC is input to a second end of the fourth light emitting diode PD4. A first end of the fourth phototransistor PT4 is connected to a first end of the fourth resistor R4, and a second end of the fourth phototransistor PT4 is connected to a first end of the resistor R15 and an input end of the ADC 50 at a node N13. A second end of the fourth resistor is connected to the third node N3. A second end of the resistor R15 is connected to a first end of the resistor R16, and a predetermined offset voltage V_OFF may be applied to a node on which a second end of the resistor R15 is connected to a first end of the resistor R16. A second end of the resistor R16 is connected to the ground HV_GND.

On levels of the control signals CS1 to CS4 may be a high level, and Off levels may be a low level. That is, a plurality of transistors TR1 to TR4 may be turned on to sink the current according to the high-level control signals CS1 to CS4, and the transistors TR1 to TR4 may be turned off according to the low-level control signals CS1 to CS4.

When the high-level first control signal CS1 is supplied from the MCU 210, the first transistor TR1 is turned on, a current flows to the first light emitting diode PD1, and the first light emitting diode PD1 emits light. According to the emission of light by the first light emitting diode PD1, the first phototransistor PT1 is turned on. When the high-level second control signal CS2 is supplied from the MCU 210, the second transistor TR2 is turned on, the current flows to the second light emitting diode PD2, and the second light emitting diode PD2 emits light. According to the emission of light by the second light emitting diode PD2, the second phototransistor PT2 is turned on. When the high-level third control signal CS3 is supplied from the MCU 210, the third transistor TR3 is turned on, the current flows to the third light emitting diode PD3, and the third light emitting diode PD3 emits light. According to the emission of light by the third light emitting diode PD3, the third phototransistor PT3 is turned on. When the high-level fourth control signal CS4 is supplied from the MCU 210, the fourth transistor TR4 is turned on, the current flows to the fourth light emitting diode PD4, and the fourth light emitting diode PD4 emits light. According to the emission of light by the fourth light emitting diode PD4, the fourth phototransistor PT4 is turned on.

The ADC 50 may receive a pack voltage signal V_PACK through an input end connected to the node N11, may receive a first voltage signal VS1 from an input end connected to the node N12, and may receive a second voltage signal VS2 from an input end connected to the node N13. The ADC 50 may convert the received pack voltage signal V_PACK, the first voltage signal VS1, and the second voltage signal VS2 into a plurality of digital signals D_V_PACK, D_VS1, and D_VS2, and may transmit the same to the isolator 60.

The isolator 60 may isolate the high voltage side and the low voltage side and may transmit the digital signals D_V_PACK, D_VS1, and D_VS2 provided by the ADC 50 to the MCU 210.

The MCU 210 may diagnose welding of the first control relay 41 and/or the second control relay 42 based on the digital signals D_V_PACK, D_VS1, and D_VS2 received from the isolator 60.

FIG. 3 shows a flowchart of a method for diagnosing welding of a first control relay according to an embodiment. While the stages S11 and S12 of FIG. 3 are progressed, the first main relay 31 and the second main relay 32 are closed.

The BMS 20 may derive the battery pack voltage based on the pack voltage signal V_PACK that corresponds to a voltage V_PP at the positive terminal of the battery pack (S11).

The MCU 210 may generate a high-level first control signal CS1 to derive the battery pack voltage. Th other control signals CS2 to CS4 may be low level. The first transistor TR1 is turned on by the high-level first control signal CS1 to allow the current to flow, the first light emitting diode PD1 emits light, and the first phototransistor PT1 is turned on. When the first phototransistor PT1 is turned on, the ADC 50 may receive the pack voltage signal V_PACK that corresponds to the battery pack voltage. For example, the pack voltage signal V_PACK may be a voltage at the node N11 generated when the voltage V_PP at the positive terminal of the battery is divided by the first resistor R1 and the resistor R11. The battery negative terminal is a ground level, the battery pack voltage follows (e.g., equates to) the voltage V_PP at the positive terminal of the battery.

The ADC 50 converts the received pack voltage signal V_PACK into a digital signal D_V_PACK and may transmit the same to the isolator 60. The isolator 60 may transmit the received digital signal D_V_PACK to the MCU 210. The MCU 210 may derive the battery pack voltage on the battery pack 10 based on the digital signal D_V_PACK.

The BMS 20 may derive a first voltage that is a voltage difference between the positive terminal of the inverter and the negative terminal of the battery pack based on the first voltage signal VS1 that corresponds to the voltage V_IP at the positive terminal of the inverter in an open condition on the first control relay 41 (S12). At the stage of S12, the second control relay 42 may be opened. In the open condition on the first control relay 41, the MCU 210 supplies a control signal CRS1 for opening the first control relay 41.

The MCU 210 may generate a high-level second control signal CS2 to derive the first voltage. The other control signals CS1, CS3, and CS4 may be low level. The second transistor TR2 is turned on by the high-level second control signal CS2 to allow the current to flow, and when the second light emitting diode PD2 emits light and the second phototransistor PT2 is turned on, the ADC 50 may receive the first voltage signal VS1 that is the voltage at the node N12.

The ADC 50 may convert the received first voltage signal VS1 into a digital signal D_VS1 and may transmit the same to the isolator 60. The isolator 60 may transmit the received digital signal D_VS1 to the MCU 210. The MCU 210 may derive the first voltage based on the digital signal D_VS1. The first voltage may represent the corresponding voltage difference between the positive terminal of the inverter and the negative terminal of the battery pack.

The BMS 20 may determine whether the first voltage derived at S12 is a voltage that follows the battery pack voltage (S13).

The BMS 20 may diagnose that the first control relay 41 is welded when the first voltage derived at S12 is a voltage that follows the battery pack voltage (S14).

When the first control relay 41 is welded in the open condition on the first control relay 41, the node N2 may be connected to the positive terminal of the battery pack, and the voltage at the node N12 follows the voltage V_PP at the positive terminal of the battery pack. That is, when the first control relay 41 is welded, the voltage V_PP at the positive terminal of the battery pack is divided by the second resistor R2, the resistor R12, and the resistor R13, and the voltage at the node N12 is different from an offset voltage. When the first control relay 41 is welded, the voltage at the node N12 may be expressed as [Equation 1].

$$V_{CR1\_wd}(N12) = \frac{R12 + R13}{R2 + R12 + R13} \times \text{V\_PP} \quad \text{(Equation 1)}$$

Here, $V_{CR1\_wd}$ N12 is a voltage at the node N12, and the voltage V_PP is the voltage at the positive terminal of the battery pack when the first control relay 41 is welded.

The BMS 20 may diagnose that the first control relay 41 is in a normal state when the first voltage derived at S12 is not a voltage that follows the battery pack voltage (S15). When the first control relay 41 is in the normal state, the node N2 is separated from the positive terminal of the battery pack, so the voltage at the node N12 may be a predetermined offset voltage V_OFF. While the first control relay 41 is not welded, the first control relay 41 may be considered to be in the normal state.

FIG. 4 shows a flowchart of a method for diagnosing welding of a second control relay according to an embodiment. While the stages S21 and S22 of FIG. 4 are progressed, the first main relay 31 and the second main relay 32 are closed.

The BMS 20 may derive the battery pack voltage based on the pack voltage signal V_PACK that corresponds to the voltage V_PP at the positive terminal of the battery pack (S21). Descriptions on this correspond to what is described in the stage of S11.

The BMS 20 may derive a second voltage that is a voltage difference between the negative terminal of the battery and the negative terminal of the inverter based on the second voltage signal VS2 that corresponds to the voltage V_IN at the negative terminal of the inverter in the open condition on the second control relay 42 (S22). In the stage of S22, the first control relay 42 may be opened. In the open condition on the second control relay 41, the MCU 210 supplies a control signal CRS2 for opening the second control relay 42.

As the negative terminal of the battery pack is the ground level, and the negative terminal of the inverter is the ground level, it is difficult to sense the voltage difference between the negative terminal of the battery and the negative terminal of the inverter in the prior art while the second control relay is welded in the open control condition.

In an embodiment, the voltage V_PP at the positive terminal of the battery pack is supplied to the node N3 through the third resistor box 430. The voltage V_IN at the negative terminal of the inverter becomes, differing from the prior art, the level that follows the voltage V_PP at the positive terminal of the battery pack, and the level is different from the voltage V_PN at the negative terminal of the battery pack. That is, when the second control relay 42 is not welded in the open control condition, the voltage difference between the negative terminal of the inverter and the negative terminal of the battery pack is generated so the welding of the second control relay 42 may be sensed based on the voltage V_IN at the negative terminal of the inverter.

The MCU 210 may generate a high-level third control signal CS3 and a high-level fourth control signal CS4 to derive a second voltage. The other control signals CS1 and CS2 may be low level. The third transistor TR3 is turned on by the high-level third control signal CS3 to allow the current to flow, the third light emitting diode PD3 emits light, and the third phototransistor PT3 is turned on. The fourth transistor TR4 is turned on by the high-level fourth control signal CS4 to allow the current to flow, the fourth light emitting diode PD4 emits light, and the fourth phototransistor PT4 is turned on When the third phototransistor PT3 and the fourth phototransistor PT4 are turned on, the ADC 50 may receive the second voltage signal VS2 that corresponds to the voltage V_IN at the negative terminal of the inverter.

The ADC 50 may convert the received second voltage signal VS2 into a digital signal D_VS2 and may transmit the same to the isolator 60. The isolator 60 may transmit the received digital signal D_VS2 to the MCU 210. The MCU 210 may derive the second voltage based on the digital signal D_VS2. The second voltage may represent the corresponding voltage difference between the negative terminal of the inverter and the negative terminal of the battery pack.

The BMS 20 may determine whether the second voltage derived at the stage of S22 is a voltage that follows the battery pack voltage (S23).

The BMS 20 may diagnose that the second control relay 42 is in the normal state when the second voltage derived in S22 is a voltage that follows the battery pack voltage (S24). The second control relay 42 may be in the normal state while the second control relay 42 is not welded.

When the second control relay 42 is in the normal state, the node N3 is separated from the negative terminal of the battery pack so the voltage at the node N13 may follow the voltage V_PP at the positive terminal of the battery pack. That is, when the second control relay 42 is in the normal state, the voltage V_PP at the positive terminal of the battery pack is divided by the third resistor R3, the fourth resistor R4, the resistor R14, the resistor R15, and the resistor R16 so the voltage at the node N13 is different from the offset voltage. While the second control relay 42 is not welded, the second control relay 42 may be considered to be in the normal state. When the second control relay 42 is in the normal state, the voltage at the node N13 may be expressed as [Equation 2].

$$V_{CR2\_nm}(N13) = \frac{R15 + R16}{R3 - R4 - R14 - R15 - R16} \times \text{V\_PP} \qquad \text{(Equation 2)}$$

Here, when the second control relay 42 is in the normal state, the $V_{CR2\_nm}$ (N13) is the voltage at the node N13, and V_PP is the voltage at the positive terminal of the battery pack.

The BMS 20 may diagnose that the second control relay 42 is welded when the second voltage derived in S22 is not a voltage that follows the battery pack voltage (S25).

While the second control relay 42 is welded, the node N3 is connected to the negative terminal of the battery pack, and the voltage at the node N13 may be a predetermined offset voltage V_OFF.

The stages S11 to S15 of FIG. 3 and the stages S21 to S25 of FIG. 4 may be simultaneously progressed, or they may be performed in order of S11 to S15 and then S21 to S25, or vice versa.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

The invention claimed is:

1. A battery system comprising:

a battery pack;

a first main relay having a first end connected to a positive terminal of the battery pack and a second main relay having a first end connected to a negative terminal of the battery pack;

a first control relay connected between the first main relay and a positive terminal of an inverter;

a second control relay connected between the second main relay and a negative terminal of the inverter;

a welding diagnosing circuit including:

a first resistor and a first photocoupler connected between the positive terminal of the battery pack and the negative terminal of the inverter and a second resistor, a second photocoupler connected between the negative terminal of the inverter and the negative terminal of the battery pack, and a third resistor and a third photocoupler connected between the positive terminal of the inverter and the negative terminal of the battery pack; and a battery management system (BMS) configured to drive the first and second photocouplers to diagnose welding of the second control relay and the third photocoupler to diagnose welding of the first control relay.

2. The battery system of claim 1, wherein the BMS is further configured to:

transmit a first control signal for driving the first photocoupler and a second control signal for driving the second photocoupler to the welding diagnosing circuit, and receive a first voltage signal corresponding to the negative terminal of the inverter when the first and second photocouplers are driven according to the first and second control signals, in an open control condition of the second control relay.

3. The battery system of claim 2, wherein the BMS is configured to derive a first voltage difference between the negative terminal of the inverter and the negative terminal of the battery pack based on the first voltage signal.

4. The battery system of claim 3, wherein the BMS is configured to diagnose that the second control relay is not welded when the first voltage difference is a voltage that follows a battery pack voltage between the positive terminal of the battery pack and the negative terminal of the battery pack.

5. The battery system of claim 3, wherein the BMS is configured to diagnose that the second control relay is welded when the first voltage difference is different from a voltage that follows a battery pack voltage between the positive terminal of the battery pack and the negative terminal of the battery pack.

6. The battery system of claim 1, wherein the BMS is configured to transmit a third control signal for driving the third photocoupler to the welding diagnosing circuit and receive a second voltage signal that corresponds to the positive terminal of the inverter when the third photocoupler is driven according to the third control signal, in an open control condition of the first control relay.

7. The battery system of claim 6, wherein the BMS is configured to derive a second voltage difference that corresponds between the positive terminal of the inverter and the negative terminal of the battery pack based on the second voltage signal.

8. The battery system of claim 7, wherein the BMS is configured to diagnose that the first control relay is welded when the second voltage difference is a voltage that follows a battery pack voltage between the positive terminal of the battery pack and the negative terminal of the battery pack.

9. The battery system of claim 7, wherein the BMS is configured to diagnose that the first control relay is not welded when the second voltage difference is different from a voltage that follows the battery pack voltage between the positive terminal of the battery pack and the negative terminal of the battery pack.

10. A method for diagnosing welding of a relay by a battery system including a battery pack, a first main relay having a first end connected to a positive terminal of the battery pack and a second main relay having a first end connected to a negative terminal of the battery pack, a first control relay connected between the first main relay and a positive terminal of an inverter, a second control relay connected between the second main relay and a negative terminal of the inverter, a welding diagnosing circuit which includes (i) a first resistor and a first photocoupler connected between the positive terminal of the battery pack and the negative terminal of the inverter and a second resistor, (ii) a second photocoupler connected between the negative terminal of the inverter and the negative terminal of the battery pack, and (iii) a third resistor and a third photocoupler connected between the positive terminal of the inverter and the negative terminal of the battery pack, and a battery management system (BMS) configured to drive the first and second photocouplers to diagnose welding of the second control relay and the third photocoupler to diagnose welding of the first control relay, the method comprising:

allowing the BMS to derive a battery pack voltage that corresponds to a voltage between the positive terminal and the negative terminal of the battery pack based on a voltage at the positive terminal of the battery pack;

connecting a gap between the positive terminal of the battery pack and the negative terminal of the inverter through the first resistor;

connecting a gap between the negative terminal of the inverter and the negative terminal of the battery pack through the second resistor; and when a voltage between the negative terminal of the inverter and the negative terminal of the battery pack is a voltage that follows the battery pack voltage, allowing the BMS to diagnose that the first control relay connected between the negative terminal of the battery pack and the negative terminal of the inverter is not welded.

11. The method of claim 10, further comprising:

when a voltage between the negative terminal of the inverter and the negative terminal of the battery pack is different from a voltage that follows the battery pack voltage, allowing the BMS to diagnose that the first control relay is welded.

12. The method of claim 10, further comprising:

connecting a gap between the positive terminal of the inverter and the negative terminal of the battery pack through the third resistor; and when a voltage between a positive terminal of the inverter and the negative terminal of the battery pack follows the battery pack voltage, allowing the BMS to diagnose that the second control relay connected between the positive terminal of the battery pack and the positive terminal of the inverter is welded.

13. The method of claim 10, further comprising:

connecting a gap between the positive terminal of the inverter and the negative terminal of the battery pack through the third resistor; and when a voltage between the positive terminal of the inverter and the negative terminal of the battery pack is different from the voltage that follows the battery pack voltage, allowing the BMS to diagnose that the second control relay connected between the positive terminal of the battery pack and the positive terminal of the inverter is not welded.

* * * * *